United States Patent
Yang

(10) Patent No.: US 7,650,372 B2
(45) Date of Patent: *Jan. 19, 2010

(54) METHOD AND APPARATUS FOR VARYING-RADIX NUMERATION SYSTEM

(75) Inventor: Rongzhen Yang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 1553 days.

This patent is subject to a terminal disclaimer.

(21) Appl. No.: 10/676,539

(22) Filed: Sep. 30, 2003

(65) Prior Publication Data

US 2004/0059762 A1   Mar. 25, 2004

Related U.S. Application Data

(63) Continuation of application No. 09/964,957, filed on Sep. 27, 2001, now Pat. No. 6,725,246.

(51) Int. Cl.
*G06F 15/00* (2006.01)
(52) U.S. Cl. .................................................... 708/204
(58) Field of Classification Search ................ 708/204; 341/62
See application file for complete search history.

(56) References Cited

U.S. PATENT DOCUMENTS 4,158,285 A * 6/1979 Heinsen et al. ............. 708/111
4,963,869 A   10/1990 Falk
5,307,173 A    4/1994 Yuen et al.
5,335,079 A    8/1994 Yuen et al.
5,603,022 A    2/1997 Ng et al.
5,678,043 A   10/1997 Ng et al.
6,549,719 B2   4/2003 Mankovitz

FOREIGN PATENT DOCUMENTS

EP   1 098 520 A2   9/1992

OTHER PUBLICATIONS

Ford, W., et al., "Data Structures With C++," Chapter 5, pp. 207-221, Prentice Hall, 1996.
General Aspects of Digital Transmission Systems—Dual Rate Speech Coder For Multimedia Communications Transmitting at 5.3 and 6.3 kbit/s, ITU-T Recommendation G.723.1, Mar. 1996.

* cited by examiner

*Primary Examiner*—Tan V Mai
(74) *Attorney, Agent, or Firm*—Blakely, Sokoloff, Taylor & Zafman LLP

(57) ABSTRACT

A method and apparatus for a varying-radix numeration system is described. A method includes receiving a first sequence of values, determining a number of positions for a second sequence of values, and generating the second sequence of values, each value of the second sequence corresponding to a radix, the radix for each value of the second sequence varying over the second sequence in relation to an application value, the application value corresponding to a position in the second sequence and a sum of a set of values in the second sequence.

12 Claims, 6 Drawing Sheets

METHOD AND APPARATUS FOR VARYING-RADIX NUMERATION SYSTEM

REFERENCE TO RELATED APPLICATION

This continuation application is related to and claims the benefit of U.S. patent application Ser. No. 09/964,957 entitled "Method and Apparatus for Varying-Radix Numeration System," filed Sep. 27, 2001 now U.S. Pat. No. 6,725,246.

BACKGROUND OF THE INVENTION

1. Field of the Invention

The invention relates to the field of data processing. More specifically, the invention relates to encoding.

2. Background of the Invention

Typically, mathematical and engineering systems use a decimal system and/or binary system to represent numbers and to perform calculations. Over time, alternative numeration systems have been developed for different applications. Such numeration systems include fixed-radix, mixed-radix and mixed-base.

A fixed-radix numeration system has a constant radix for all positions of a sequence of digits. In fixed-radix numeration systems, the weights of successive positions are successive integral powers of a single radix, multiplied by the same factor. Examples of fixed-radix numeration systems include decimal, binary and hexadecimal systems.

A mixed-radix numeration system is a radix numeration system in which all radices of each position of a sequence of digits are constant, but not necessarily the same. The mixed-radix numeration system is a more general numeration system in which there may not be integral ratios between the radices of all digits. For example, time is measured with a mixed-radix numeration system. Hours are measured in tens of minutes and minutes having radices 6 and 10 respectively.

In a mixed-based numeration system, numbers are represented as the sum of a sequence of position values. Each position consists of a mantissa and a base. The base of a given position is constant for a given application, but the bases across positions are not necessarily integral ratios between the radices of all the positions. For example, years are measured with a mixed-base numeration system. Years are measured with tens of months and months having bases 12:10:1.

The above numeration systems are satisfactory methods to represent numbers, but are inefficient for modeling operation sequences. The above numeration systems are also inefficient for transmission of data in some special cases.

BRIEF DESCRIPTION OF THE DRAWINGS

The invention may best be understood by referring to the following description and accompanying drawings that are used to illustrate embodiments of the invention. In the drawings.

DETAILED DESCRIPTION OF THE INVENTION

In the following description, numerous specific details are set forth to provide a thorough understanding of the invention. However, it is understood that the invention may be practiced without these specific details. In other instances, well-known circuits, structures, and techniques have not been shown in detail in order not to obscure the invention.

Figure 1:
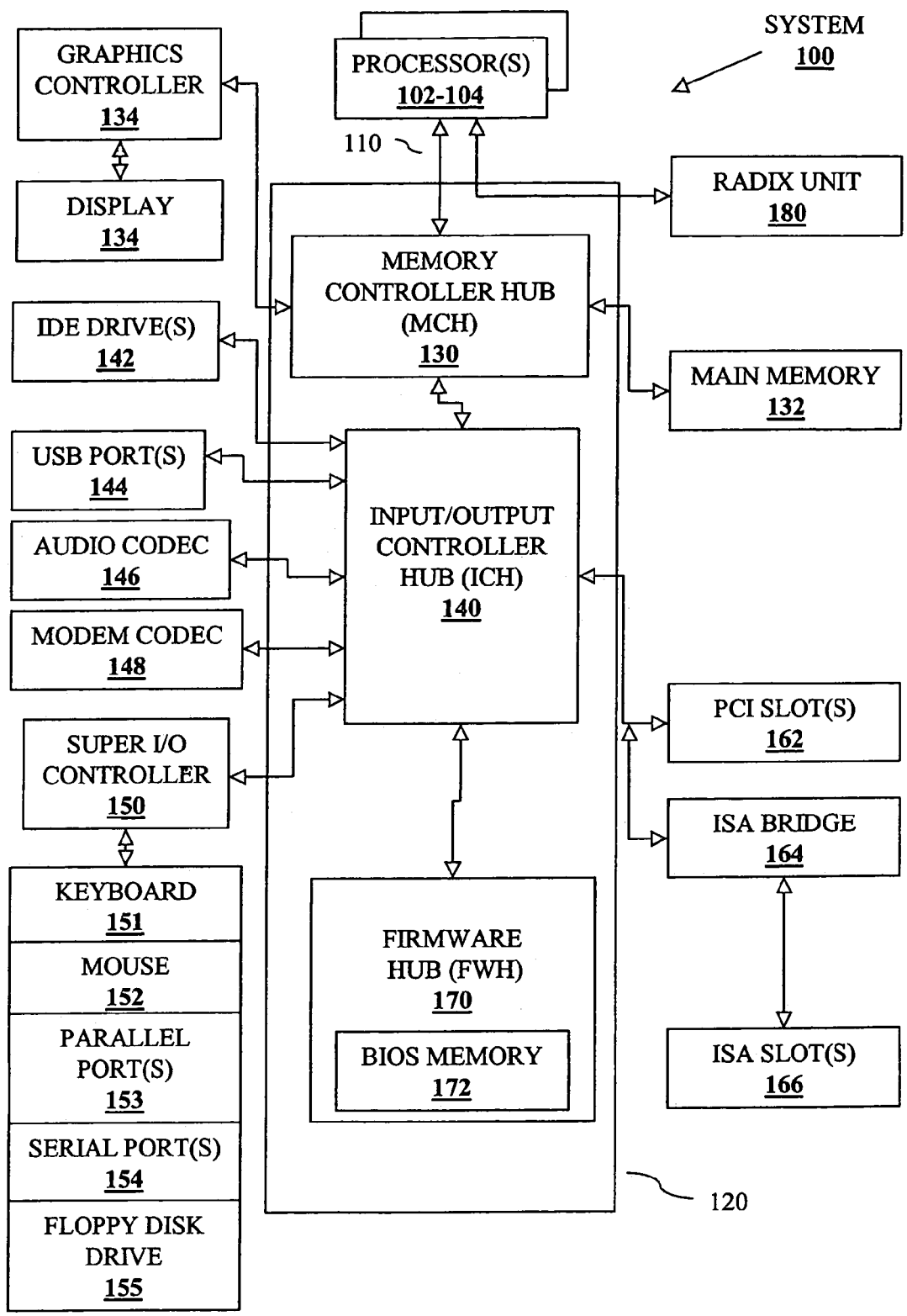
FIG. 1 illustrates an exemplary system 100 comprising processors 102 and 104 for generating a varying-radix sequence, according to embodiments of the present invention.

FIG. 1 illustrates an exemplary system 100 comprising a radix unit 180 for generating a varying-radix sequence, according to embodiments of the present invention. Although described in the context of system 100, embodiments of the present invention may be implemented in any suitable computer system comprising any suitable one or more integrated circuits.

As illustrated in FIG. 1, computer system 100 comprises processor 102 and processor 104. Computer system 100 also includes processor bus 110, and chipset 120. Processors 102 and 104 and chipset 120 are coupled to processor bus 110. Processors 102 and 104 may each comprise any suitable processor architecture and for one embodiment comprise an Intel® Architecture used, for example, in the Pentium® family of processors available from Intel® Corporation of Santa Clara, Calif. Computer system 100 for other embodiments may comprise one, three, or more processors any of which may execute a set of instructions that are in accordance with embodiments of the present invention.

Chipset 120 for one embodiment comprises memory controller hub (MCH) 130, input/output (I/O) controller hub (ICH) 140, and firmware hub (FWH) 170. MCH 130, ICH 140, and FWH 170 may each comprise any suitable circuitry and for one embodiment is each formed as a separate integrated circuit chip. Chipset 120 for other embodiments may comprise any suitable one or more integrated circuit devices.

MCH 130 may comprise any suitable interface controllers to provide for any suitable communication link to processor bus 110 and/or to any suitable device or component in communication with MCH 130. MCH 130 for one embodiment provides suitable arbitration, buffering, and coherency management for each interface.

MCH 130 is coupled to processor bus 110 and provides an interface to processors 102 and 104 over processor bus 110. Processor 102 and/or processor 104 may alternatively be combined with MCH 130 to form a single chip. MCH 130 for one embodiment also provides an interface to a main memory 132 and a graphics controller 134 each coupled to MCH 130. Main memory 132 stores data and/or instructions, for example, for computer system 100 and may comprise any suitable memory, such as a dynamic random access memory (DRAM) for example. Graphics controller 134 controls the display of information on a suitable display 136, such as a cathode ray tube (CRT) or liquid crystal display (LCD) for example, coupled to graphics controller 134. MCH 130 for one embodiment interfaces with graphics controller 134 through an accelerated graphics port (AGP). Graphics controller 134 for one embodiment may alternatively be combined with MCH 130 to form a single chip.

MCH 130 is also coupled to ICH 140 to provide access to ICH 140 through a hub interface. ICH 140 provides an interface to I/O devices or peripheral components for computer system 100. ICH 140 may comprise any suitable interface controllers to provide for any suitable communication link to MCH 130 and/or to any suitable device or component in communication with ICH 140. ICH 140 for one embodiment provides suitable arbitration and buffering for each interface.

For one embodiment, ICH 140 provides an interface to one or more suitable integrated drive electronics (IDE) drives 142, such as a hard disk drive (HDD) or compact disc read only memory (CD ROM) drive for example, to store data and/or instructions for example, one or more suitable universal serial bus (USB) devices through one or more USB ports 144, an audio coder/decoder (codec) 146, and a modem codec 148. ICH 140 for one embodiment also provides an interface through a super I/O controller 150 to a keyboard 151, a mouse 152, one or more suitable devices, such as a printer for example, through one or more parallel ports 153, one or more suitable devices through one or more serial ports 154, and a floppy disk drive 155. ICH 140 for one embodiment further provides an interface to one or more suitable peripheral component interconnect (PCI) devices coupled to ICH 140 through one or more PCI slots 162 on a PCI bus and an interface to one or more suitable industry standard architecture (ISA) devices coupled to ICH 140 by the PCI bus through an ISA bridge 164. ISA bridge 164 interfaces with one or more ISA devices through one or more ISA slots 166 on an ISA bus.

ICH 140 is also coupled to FWH 170 to provide an interface to FWH 170. FWH 170 may comprise any suitable interface controller to provide for any suitable communication link to ICH 140. FWH 170 for one embodiment may share at least a portion of the interface between ICH 140 and super I/O controller 150. FWH 170 comprises a basic input/output system (BIOS) memory 172 to store suitable system and/or video BIOS software. BIOS memory 172 may comprise any suitable non-volatile memory, such as a flash memory for example.

The system 100 illustrated in FIG. 1 also includes a radix unit 180. The radix unit 180 is coupled with the processors 102 and 104. In an embodiment, the radix unit 180 can be processes or tasks that can reside within main memory 132 and/or processors 102 and 104 and can be executed within processors 102 and 104. However, embodiments of the present invention are not so limited, as the radix unit 180 can be different types of hardware (such as digital logic) executing the processing described herein (which is described in more detail below).

Accordingly, computer system 100 includes a machine-readable medium on which is stored a set of instructions (i.e., software) embodying any one, or all, of the methodologies to be described below. For example, software can reside, completely or at least partially, within main memory 132 and/or within processors 102/104. For the purposes of this specification, the term "machine-readable medium" shall be taken to include any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

Figure 2:
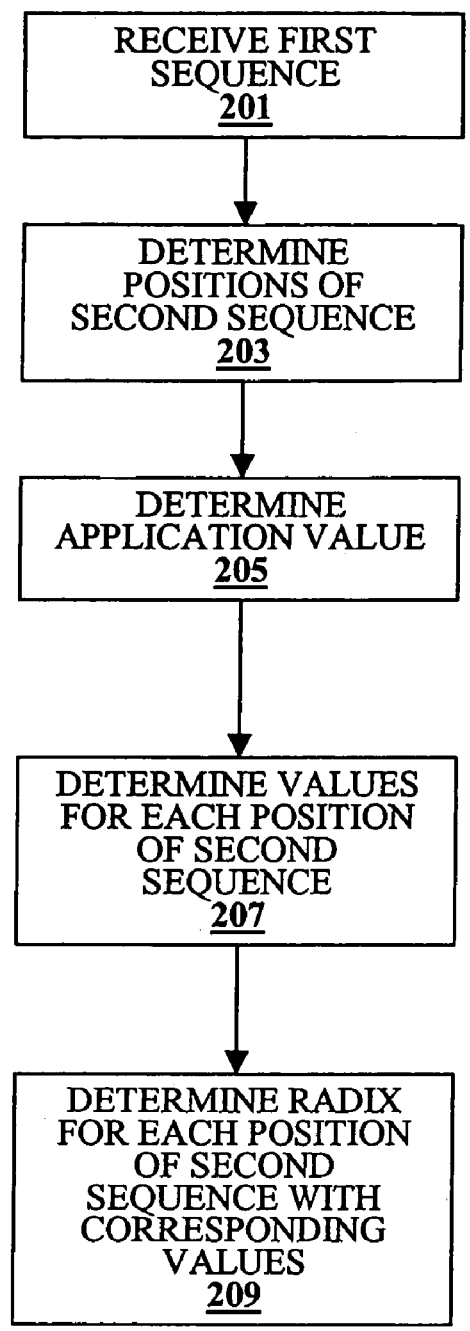
FIG. 2 is a flow chart for generating a varying-radix sequence according to one embodiment of the invention.

FIG. 2 is a flow chart for generating a varying-radix sequence according to one embodiment of the invention. At block 201, the radix unit 180 receives a first sequence. At block 203, the radix unit 180 determines the number of positions of a second sequence for representing the first sequence. If the radix unit 180 determines that k+1 positions are necessary to represent the first sequence, then the second sequence can be described as the following: v(k) v(k−1) v(k−2) . . . v(i) . . . v(1). For the $i^{th}$ position of the sequence, v(i) is the value. The v(0) is not shown in the sequence because it can be calculated from equation 1 as follows:

$$v(0) = p(0) - \sum_{i=1}^{k} v(i) \tag{1}$$

At block 205, the radix unit 180 determines an application value from the function p(i). The function p(i) is based on a set of rules derived for an application or set of applications. In one embodiment of the invention, the function p(i) is a constant value dependent on the application. In another embodiment of the invention, the function p(i) defines the maximum radix of the second sequence.

At block 207, the processor 102 determines v(i) for each position of the second sequence. In another embodiment of the invention, the radix unit 180 performs block 207 before block 205. At block 209, the processor 102 calculates the radix for each position, designated by o(i), of the second sequence in accordance with equation 2 as follows:

$$o(i) = p(i) + 1 - \sum_{j=i+1}^{k} v(j) \quad i = 1 \ldots k \tag{2}$$

The embodiments of the present invention can be applied to model or represent sequence problems related to position information. The second sequence described in FIG. 2, is a varying-radix sequence in which the radix of each position of the second sequence varies according to the value expressed by the second sequence.

Figure 3:
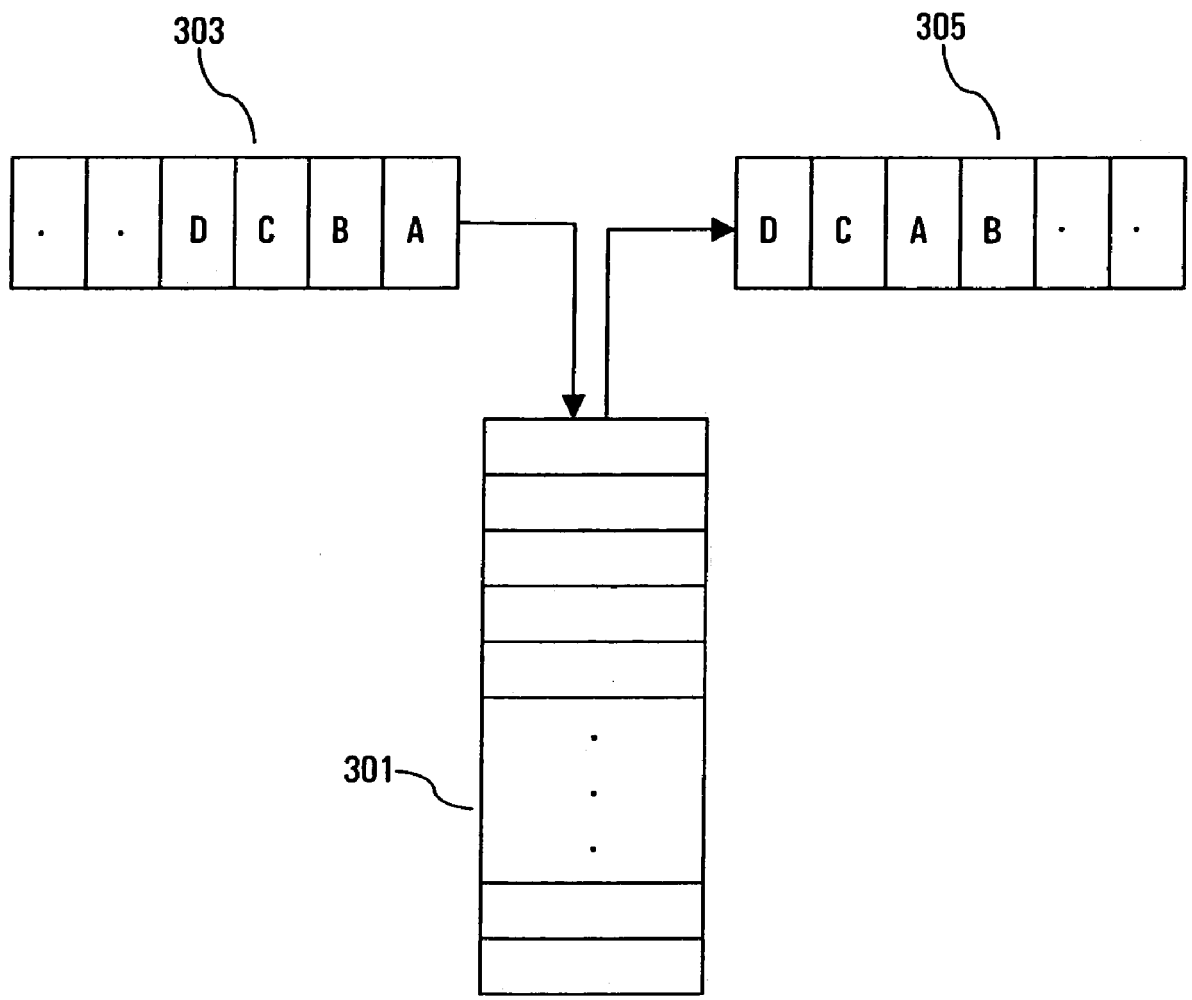
FIG. 3 is a block diagram illustrating an example of stack manipulation according to one embodiment of the invention.

FIG. 3 is a block diagram illustrating an example of stack manipulation according to one embodiment of the invention. In FIG. 3, an input queue 303 contains variables D,C,B, and A from left to right. The variables of the input queue 303 are pushed into a first-in-last out (FILO) stack 301. Items from the FILO stack 301 are popped into the output queue 305. In FIG. 3, the variables from the input queue 303 have been pushed into and popped out of the FILO stack 301 resulting in the output stack 305 containing the variables in the order D,C,A,B from left to right.

If the stack operations illustrated in FIG. 3 are represented with a binary sequence, where the value "1" represents a push onto the FILO stack 301 and the value "0" represents a pop from the FILO stack 301, then the operations resulting in the output queue 305 can be represented by the following bit sequence: 11001010.

In the stack operation sequence, the number of zeros occurring between consecutive ones varies. The number of zeroes occurring between consecutive ones can be indicated by v(i). The binary stack operation sequence can be modeled by four values in the following way:

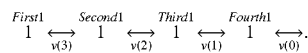

Since the input queue 303 and the output queue 305 only contain 4 variables, only 4 pop operations can occur (i.e., only four zeroes can occur in the binary stack operation sequence). Since the maximum number of pop operations is equal to four, then the maximum number of pop operations can be defines with equation 3 as follows:

$$\sum_{i=0}^{3} v(i) = 4 \quad (3)$$

Hence the following set of equations can be derived to determine the values of the varying-radix sequence:

$$v(3) \le 1 \quad (4)$$
$$v(2) \le 2 - v(3)$$
$$v(1) \le 3 - v(2) - v(3)$$
$$v(0) \le 4 - v(1) - v(2) - v(3)$$

As shown by the equation for v(0), v(0) can be ascertained from v(3), v(2), v(1). Therefore, the binary stack operation sequence can be modeled by a three position varying radix sequence v(3), v(2), v(1).

Using the previously described equation for determining o(i), the radices for each of the positions of the varying-radix sequence are as follows: o(3)=2, o(2)=3−v(3), o(1)=4−v(2)−v(3). These radices are derived with the radix equation given p(i)=4−i. In this example, the function p(i) indicates the maximum number of pop operations possible for the $i^{th}$ position. For example, after two push operations, at most two pop operations may be performed. Therefore the binary stack operation sequence illustrated in FIG. 3 can be modeled in a more compact form than the binary sequence 11001010 with the varying-radix sequence 021 with radices 232. Every possible stack operation sequence with four variables in the FILO stack is illustrated in the table below.

| Model of FILO stack operations | | | | | |
|---|---|---|---|---|---|
| Varying-radix number | | | Radices of different positions | | |
| v(3) | v(2) | v(1) | o(3) | o(2) | o(1) |
| 0 | 0 | 0 | 2 | 3 | 4 |
| 0 | 0 | 1 | 2 | 3 | 4 |
| 0 | 0 | 2 | 2 | 3 | 4 |
| 0 | 0 | 3 | 2 | 3 | 4 |
| 0 | 1 | 0 | 2 | 3 | 3 |
| 0 | 1 | 1 | 2 | 3 | 3 |
| 0 | 1 | 2 | 2 | 3 | 3 |
| 0 | 2 | 0 | 2 | 3 | 2 |
| 0 | 2 | 1 | 2 | 3 | 2 |
| 1 | 0 | 0 | 2 | 2 | 3 |
| 1 | 0 | 1 | 2 | 2 | 3 |
| 1 | 0 | 2 | 2 | 2 | 3 |
| 1 | 1 | 0 | 2 | 3 | 2 |
| 1 | 1 | 1 | 2 | 2 | 2 |

The embodiment of the present invention provides a compact sequence with varying-radices that provides the same information as a longer fixed-radix or mixed-radix sequence. The distribution of bits in a binary sequence can be indicated with a more efficient and compact varying-radix sequence as illustrated in FIG. 3.

The embodiments of the present invention can also provide gains of efficiency in data including video data and audio data. For example, in the multi-pulse excited linear prediction (MPELP) speed codec, an excitation sequence, which consists of multiple uniformly spaced pulses is transmitted as a residual signal. In the residual signal, both the amplitude and position of the pulses are determined sequentially one pulse at a time during analysis. The MPELP algorithm typically uses four to six pulses every five milliseconds. Encoding an excitation sequence with the MPELP algorithm is more expensive than classical linear predictive vocoders. The MPELP algorithm is more expensive because MPELP encodes both the amplitudes and the positions of the pulses. The embodiment of the present invention can more efficiently represent an excitation sequence.

Figure 4:
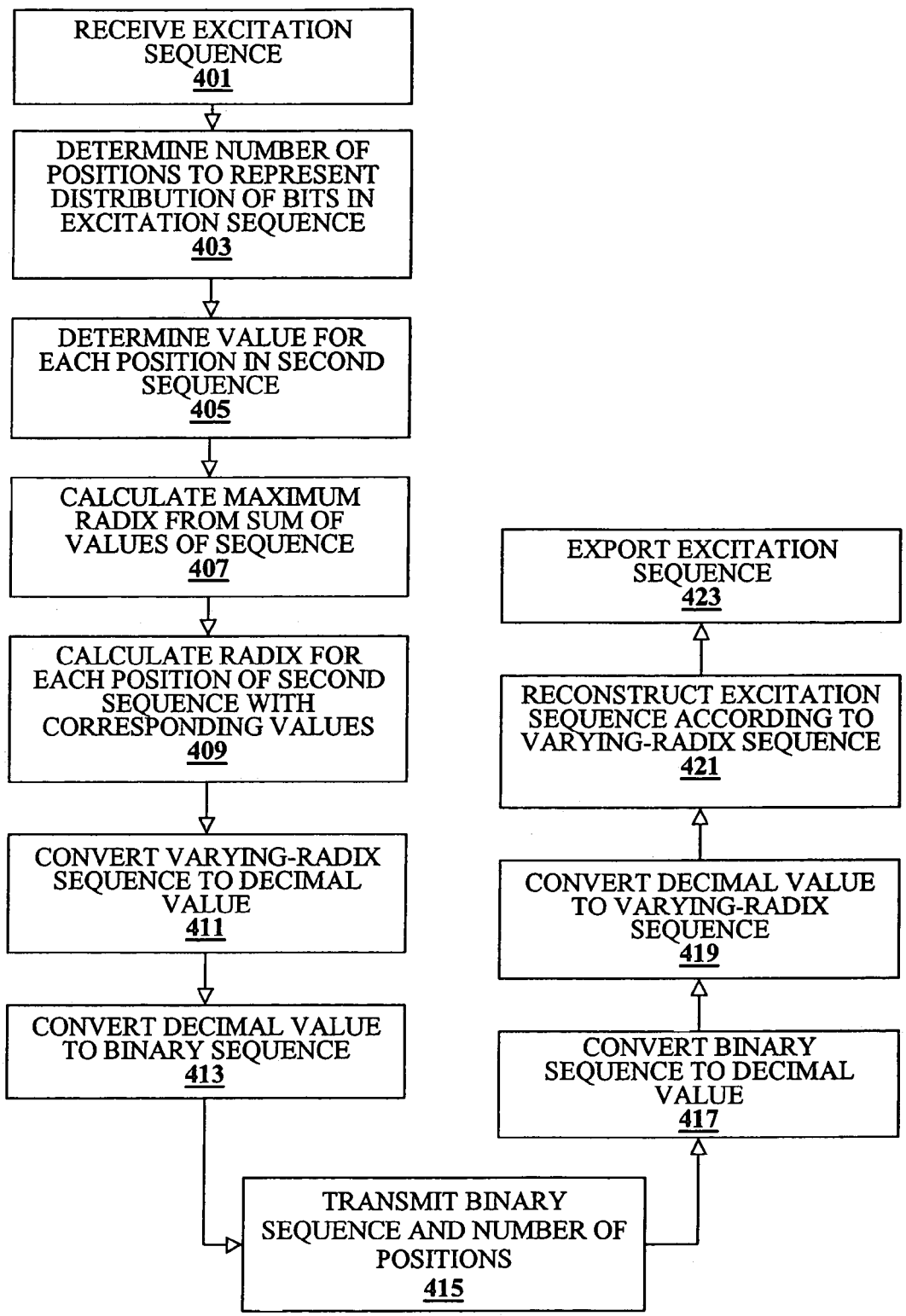
FIG. 4 is a flow chart for encoding an excitation sequence into a varying-radix sequence according to one embodiment of the invention.
Figure 5:
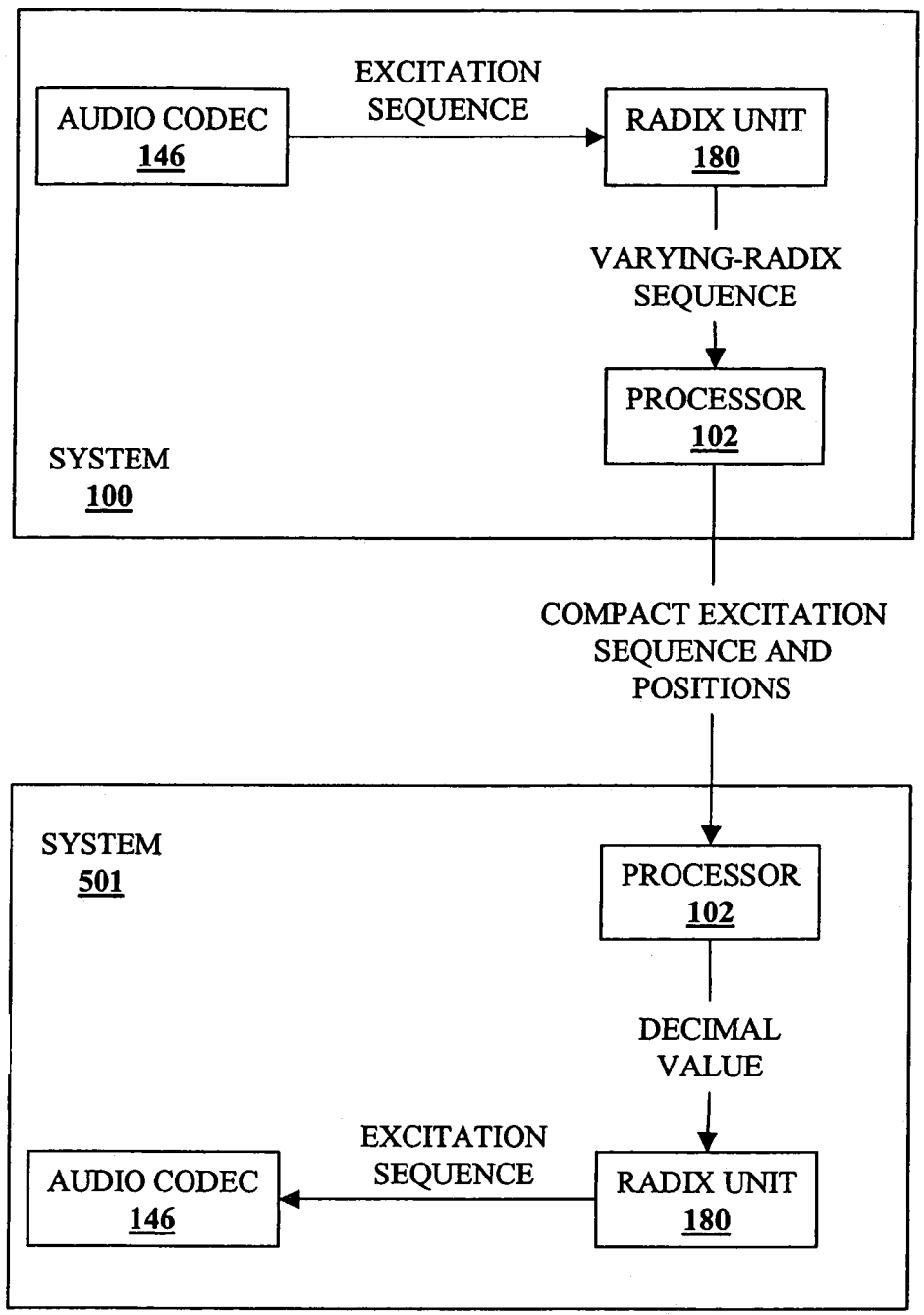
FIG. 5 is a diagram illustrating transmission of an excitation sequence according to one embodiment of the invention.

FIG. 4 is a flow chart for encoding an excitation sequence into a varying-radix sequence and transmitting the varying-radix sequence according to one embodiment of the invention. FIG. 5 is a diagram illustrating transmission of an excitation sequence according to one embodiment of the invention. FIG. 4 will be described with reference to FIG. 5. At block 401 a 30 bit excitation sequence is received. In FIG. 5, an excitation sequence is shown being transmitted from the audio codec 146 of the system 100 to the radix unit 180 of the system 100. At block 403, the radix unit determines the numbers of bits to be used for encoding the excitation sequence into a varying-radix sequence. The varying-radix sequence will represent the distribution of bits of the binary excitation sequence. To conform with the International Telecommunications Union (ITU) G.723 Standard, the excitation sequence contains M pulses, which is six for even subframes and five for odd subframes. Hence, there are $$\binom{30}{M}$$

possible positional bit distributions. For ease of understanding, we will assume that M is six. Since $$2^{19} \le \binom{30}{6} \le 2^{20},$$

then 20 bits is enough to represent positional bit distribution information of the excitation sequence instead of the 30 bits as represented by the excitation sequence.

It can already be seen that the embodiment of the present invention reduces the amount of data for an excitation sequence by 10 bits per frame. In this example, p(i) is equal to N−M (N=30 which is the total number of bits in a subframe and M is the number of Direc functions in a subframe). The excitation sequence can be represented by the compact varying-radix sequence v(M) v(M−1)...v(1).

As in the above example, v(0) can be determined with the following:

$$v(0) = p(0) - \sum_{i=1}^{M} v(i) \quad (5)$$

At block 405, the radix unit 180 determines each v(i) for the varying-radix sequence. The v(i) represents the number of zero bits occurring between 1 bits in the excitation sequence. In another embodiment of the invention, v(i) represents the number of 0 bits preceding a 1 bit. In an alternative embodiment of the invention, v(i) represents the number of 1 bits between 0 bits. At block 407, the radix unit 180 calculates the maximum radix (i.e., p(i)) for the varying-radix sequence from the sum of values of the varying-radix sequence as in equation 3.

At block 409, the radix unit 180 calculates a radix for each v(i) in the varying-radix sequence. The radix for each v(i) is calculated from equation 6 as follows:

$$o(i) = N - M + 1 - \sum_{j=i+1}^{M} v(j) \quad i = 1 \ldots M. \quad (6)$$

In FIG. 5, the radix unit 180 transmits the varying-radix sequence to the processor 102 of the system 100. At block 411 of FIG. 4, the processor 102 converts the varying-radix sequence into a decimal value. The decimal value for the varying-radix sequence v(M) v(M−1) v(M−2)... v(1) can be determined from the following equation:

$$\text{Decimal Value} = \sum_{i=1}^{M} \sum_{p=0}^{v(i)-1} \left[ N - M + 1 - \sum_{j=i+1}^{k} v(j) - \frac{p}{i-1} + i - 2 \right] \quad (7)$$

At block 413, the processor 102 converts the decimal value into a 20 bit binary sequence ("the compact excitation sequence").

At block 415, the compact excitation sequence and the number of positions (determined at block 403) are transmitted to another radix unit 180. In FIG. 5, the system 100 is shown transmitting the compact excitation sequence and the number of positions to a system 501. The compact excitation sequence can be transmitted over a physical medium (e.g., Ethernet cable, coaxial cable, optical fiber, etc.), a wireless medium, or other forms of propagated signals. The compact excitation sequence can also be transmitted from the system 100 to the system 501 by a fixed medium (e.g., diskette, optical disk, etc.).

FIG. 5 illustrates the processor 102 of the system 501 receiving the compact excitation sequence. At block 417 of FIG. 4, the processor 102 converts the compact excitation sequence into its decimal value.

In FIG. 5, the processor 102 of the system 501 transmits the decimal value to the radix unit 180 of the system. 501. At block 419 of FIG. 4, radix unit 180 restores the decimal value to the varying-radix sequence v(M) v(M−1) v(M−2) ... v(1) v(0).

At block 421, the radix unit 180 reconstructs the 30 bit excitation sequence from the varying-radix sequence v(M) v(M−1) v(M−2) ... v(1) v(0). At block 423, the radix unit 180 exports the excitation sequence. FIG. 5 illustrates the radix unit 180 of the system 501 transmitting the excitation sequence to the audio codec 146 of the system 501.

In alternative embodiments of the invention, tasks can be divided among units in a variety of ways. In one embodiment of the invention, the radix unit 180 of the system 100 converts the varying-radix sequence to a decimal value and transmits the decimal value to the processor 102 of the system 100, which converts the decimal value to the compact excitation sequence. In another embodiment of the invention, the radix unit 180 of the system 100 converts the varying-radix sequence to the decimal value and converts the decimal value to the compact excitation sequence. In another embodiment of the invention, the radix unit 180 of the system 501 calculates the compact excitation sequence into its corresponding decimal value. In another embodiment of the invention, the radix unit 180 of the system 501 transmits the varying-radix sequence to the processor 102, which reconstructs the excitation sequence from the varying-radix sequence.

Figure 6:
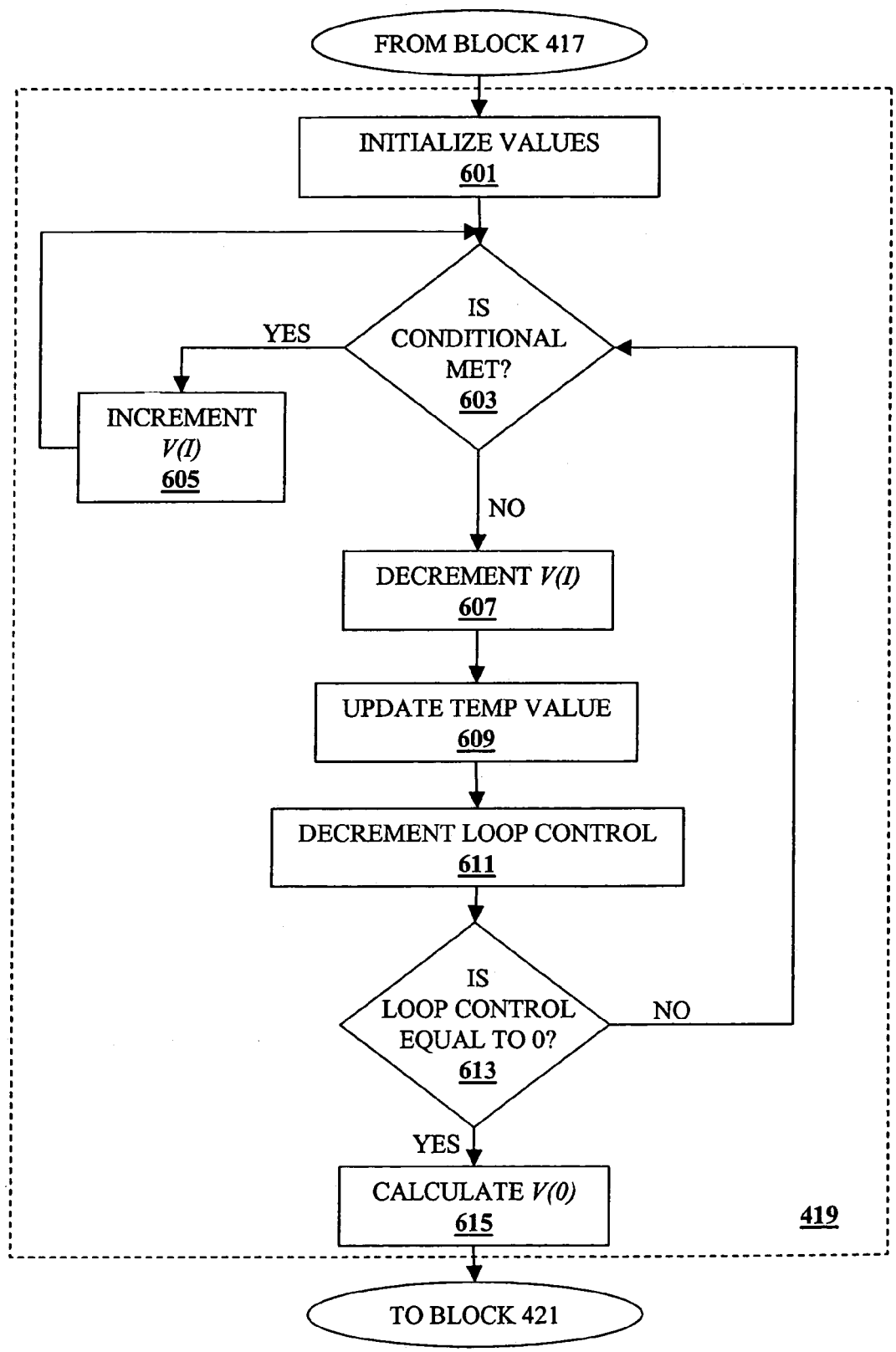
FIG. 6 is a flowchart for converting a decimal value to a varying-radix sequence as in block 419 of FIG. 4 according to one embodiment of the invention.

FIG. 6 is a flowchart for converting a decimal value to a varying-radix sequence as in block 419 of FIG. 4 according to one embodiment of the invention. At block 601, a temporary value ("temp") is initialized with the decimal value, a loop control variable i is initialized with M (M+1 being the number of positions in the varying-radix sequence received from the system 100 in FIG. 5), and v(i)$_{i=0 \ldots M}$ are initialized to 0. At block 603, the processor 102 or the radix unit 180 determines if the following conditional is satisfied:

$$\text{Temp} >= \sum_{p=0}^{v(i)-1} \left[ N - M + 1 - \sum_{j=i+1}^{k} v(j) - \frac{p}{i-1} + i - 2 \right] \quad (8)$$

If the processor 102 or the radix unit 180 determines the conditional to be true, then at block 605 v(i) of the varying-radix sequence is incremented. From block 605, control flows back to block 603. If the processor 102 or radix unit 180 determines that the conditional is false, then at block 607 v(i) of the varying-radix sequence is decremented.

At block 609, the temporary variable is updated in accordance with equation 9 as follows:

$$\text{Temp} = \text{Temp} - \sum_{p=0}^{v(i)-1} \left[ N - M + 1 - \sum_{j=i+1}^{k} v(j) - p + i - 2 \right] \quad (9)$$

At block 611, the loop control variable is decremented. At block 0.613, the processor 102 or radix unit 180 determines if the loop control variable is equal to 0. If the loop control variable is not equal to 0, then control flows back to block 603. If the loop control variable is equal to 0, then at block 615 v(0) is calculated in accordance with equation 10 as follows:

$$v(0) = p(0) - \sum_{i=1}^{M} v(i) = N - M - \sum_{i=1}^{M} v(i) \quad (10)$$

The embodiments of the present invention provide a method for modeling not possible with traditional numerations systems. In addition, the embodiments of the present invention enable compact representation of sequences. Various data, such as audio data and video data, can be represented in compact form thus reducing bandwidth consumption when transmitting such data over networks.

While the invention has been described in relation to stack manipulation, other embodiments of the invention provide for a data structure based on a varying-radix numeration system. Alternative embodiments of the invention can involve modeling a search sequence with a varying-radix numeration system. Therefore, the invention is not limited to modeling stack manipulation. In addition, while the invention has been described in relation to an excitation sequence, alternative embodiments could be implemented such that motion vectors of video data are represented with a varying-radix numeration system. In alternative embodiments of the invention, various aspects of video data including contrast, color, background images, etc., can be represented with a varying-radix numeration system.

While the invention has been described in terms of several embodiments, those skilled in the art will recognize that the invention is not limited to the embodiments described.

The method and apparatus of the invention can be practiced with modification and alteration within the spirit and scope of the appended claims. The description is thus to be regarded as illustrative instead of limiting on the invention.

What is claimed is:

1. A processor-implemented method comprising:
    receiving a binary sequence of values, the values to be used in an application as a varying-radix sequence of values, the varying-radix sequence of values to represent bit distribution information for the binary sequence of values; and
    generating the varying-radix sequence of values from the binary sequence of values via a radix unit executed by the processor, the radix unit to
        determine a number of positions for the varying-radix sequence of values,
        determine the maximum radix for the varying-radix sequence of values, the maximum radix based on a set of rules for the application,
        determine the remaining radices for the varying-radix sequence of values based on the maximum radix and the set of rules for the application, and
        determine a value for each position of the varying-radix sequence of values.

2. The method of claim 1 further comprising:
    converting the varying-radix sequence of values into a decimal value;
    converting the decimal value into an additional binary sequence;
    transmitting the additional binary sequence and the number of positions for the varying-radix sequence of values;
    restoring the additional binary sequence to the decimal value;
    generating the varying-radix sequence of values from the decimal value and the number of positions; and
    reconstructing the binary sequence from the varying-radix sequence of values.

3. The method of claim 1, wherein the application includes a First In Last Out (FILO) stack and the binary sequence represents a sequence of operations on the FILO stack.

4. The method of claim 1, wherein the application includes a Multi-Pulse Excited Linear Prediction (MPELP) speed codec.

5. A machine-readable storage medium that provides instructions, which when executed by a set of one or more processors, cause said set of processors to perform operations comprising:
    receiving a binary sequence of values, the values to be used in an application as a varying-radix sequence of values, the varying-radix sequence of values to represent bit distribution information for the binary sequence of values; and
    generating the varying-radix sequence of values from the binary sequence of values via a radix unit executed by the processor, the radix unit to
        determine a number of positions for the varying-radix sequence of values,
        determine the maximum radix for the varying-radix sequence of values, the maximum radix based on a set of rules for the application,
        determine the remaining radices for the varying-radix sequence of values based on the maximum radix and the set of rules for the application, and
        determine each value for each position of the varying-radix sequence of values.

6. The machine-readable storage medium of claim 5 further comprising:
    converting the varying-radix sequence of values into a decimal value;
    converting the decimal value into an additional binary sequence;
    transmitting the additional binary sequence and the number of positions for the varying-radix sequence of values;
    restoring the additional binary sequence to the decimal value;
    generating the varying-radix sequence of values from the decimal value and the number of positions; and
    reconstructing the binary sequence from the varying-radix sequence of values.

7. The machine-readable storage medium of claim 5, wherein the application includes a First In Last Out (FILO) stack and the binary sequence represents a sequence of operations on the FILO stack.

8. The machine-readable storage medium of claim 5, wherein the application includes a Multi-Pulse Excited Linear Prediction (MPELP) speed codec.

9. An apparatus comprising:
    a processor to receive a binary sequence of values, the values to be used in an application as a varying-radix sequence of values, the varying-radix sequence of values to represent bit distribution information for the binary sequence of values; and
    a radix unit operatively coupled to the processor to generate the varying-radix of values from the binary sequence of values via a radix unit executed by the processor, wherein generating the varying-radix sequence of values includes
        determining a number of positions for the varying-radix sequence of values,
        determining the maximum radix for the varying-radix sequence of values, the maximum radix based on a set of rules for the application,
        determining the remaining radices for the varying-radix sequence of values based on the maximum radix and the set of rules for the application, and
        determining each value for each position of the varying-radix sequence of values.

10. The apparatus of claim 9, the processor to further
    convert the varying-radix sequence of values into a decimal value,
    convert the decimal value into an additional binary sequence,
    transmit the additional binary sequence and the number of positions for the varying-radix sequence of values,
    restore the additional binary sequence to the decimal value,
    generate the varying-radix sequence of values from the decimal value and the number of positions, and
    reconstructing the binary sequence from the varying-radix sequence of values.

11. The apparatus of claim 9, wherein the application includes a First In Last Out (FILO) stack and the binary sequence represents a sequence of operations on the FILO stack.

12. The apparatus of claim 9, wherein the application includes a Multi-Pulse Excited Linear Prediction (MPELP) speed codec.

* * * * *